United States Patent [19]
Wonsowicz

[11] Patent Number: 4,460,416
[45] Date of Patent: Jul. 17, 1984

[54] METHOD FOR FABRICATING IN-SITU DOPED POLYSILICON EMPLOYING OVERDAMPED GRADUALLY INCREASING GAS FLOW RATES WITH CONSTANT FLOW RATE RATIO

[75] Inventor: Casimir J. Wonsowicz, San Diego, Calif.

[73] Assignee: Burroughs Corporation, Detroit, Mich.

[21] Appl. No.: 450,115

[22] Filed: Dec. 15, 1982

[51] Int. Cl.³ .......................................... H01L 21/205
[52] U.S. Cl. .................................. 148/174; 148/175; 148/188; 427/85; 427/86
[58] Field of Search .................. 148/174, 175, 188; 427/85, 86

[56] References Cited

U.S. PATENT DOCUMENTS

| | | | |
|---|---|---|---|
| 3,930,908 | 1/1976 | Jolly | 148/175 |
| 3,945,864 | 3/1976 | Goldsmith et al. | 148/175 |
| 4,087,571 | 5/1978 | Kamins et al. | 427/86 |
| 4,100,310 | 7/1978 | Ura et al. | 427/85 X |
| 4,217,375 | 8/1980 | Adams | 427/85 |
| 4,313,253 | 2/1982 | Henderson | 29/571 |
| 4,341,818 | 7/1982 | Adams et al. | 427/85 |
| 4,354,307 | 10/1982 | Vinson et al. | 29/571 |

*Primary Examiner*—G. Ozaki
*Attorney, Agent, or Firm*—Charles J. Fassbender; Kevin R. Peterson

[57] ABSTRACT

A method of fabricating a film of in-situ doped polycrystalline silicon having a surface that is free of microscopic hillocks includes the steps of providing a deposition chamber and a wafer therein on which the film is to be fabricated and introducing one gas containing silicon atoms and another gas containing dopant atoms into said chamber with respective flow rates; wherein the respective flow rates are gradually increased in an overdamped fashion over a start-up time interval of at least one minute from zero to respective steady state values while simultaneously the ratio of the respective flow rates is kept within 25% of the ratio of said steady state values.

15 Claims, 7 Drawing Figures

METHOD FOR FABRICATING IN-SITU DOPED POLYSILICON EMPLOYING OVERDAMPED GRADUALLY INCREASING GAS FLOW RATES WITH CONSTANT FLOW RATE RATIO

BACKGROUND OF THE INVENTION

This invention relates to methods for fabricating in-situ doped polycrystalline silicon films for use in semiconductor integrated circuits.

Polycrystalline silicon films have a large number of uses in integrated circuits. For example, see U.S. Pat. No. 4,354,307 issued to Vinson et al and assigned to Burroughs Corporation wherein reference numeral 31 indicates the gate of a field effect transistor that is fabricated by a patterned polycrystalline silicon layer. See also U.S. Pat. No. 4,313,253 issued to Henderson and assigned to Burroughs Corporation wherein reference numeral 17 indicates a storage plate of a dynamic memory cell that is fabricated by a patterned polycrystalline silicon layer.

In the fabrication of such transistor gates, memory storage plates, and other integrated circuit structures, it is desirable to have the surface of the polycrystalline silicon film extremely smooth. Microscopic bumps or hillocks on the polycrystalline surface can cause shorts through any overlying insulating layer to any conductor that lies on top of the insulating layer. Also, microscopic voids in the polycrystalline surface can trap contaminants which reduce circuit reliability and cause circuit failure.

Also, it is desirable for the polysilicon film to have a low sheet resistivity. This is because parasitic capacitances are always present in any circuit; and when such capacitances couple to a patterned polycrystalline silicon film, they give rise to an R-C time constant which limits the speed at which the circuit operates.

Further, it is desirable for the polycrystalline film to have a grain size that is uniform and small (e.g., less than 0.2 um diameter) at the time it is patterned. This is because various etchants that are commonly used to pattern the film will attack the film along grain boundaries. Thus, the accuracy and minimal dimensions with which the film can be patterned is limited by the grain size.

Also, it is desirable that the process by which the polycrystalline layer is fabricated be one which requires only a small number of steps and be one which is carried out relatively quickly. Otherwise, the process is not economically suitable for a mass production environment.

In the prior art, however, all of the above desirable features have not been simultaneously obtained because to obtain some of them required the others to be compromised. For example, conventional practice is to grow the polycrystalline layer undoped, and thereafter diffuse dopant atoms into the layer to make it conductive. But that diffusion requires a high temperature (e.g., 1000° C.) which in turn causes the grain size of the polycrystals to grow. Also, the separate diffusion step adds to the cost and time of fabricating the poly layer.

See also an article entitled "The Doping of Polycrystalline Silicon During Deposition and with Diffusion", by Splittgerber et al, Semiconductor Silicon, 1977, pp. 253–260. FIG. 4 in Splittgerber shows that the minimal sheet resistance for a phosphorus doped polycrystalline silicon film is obtained by growing the film at a temperature of about 700° C. However, FIG. 14 shows that for the phosphorous doped polycrystalline silicon film, the maximum surface roughness also occurs at 700° C.

Further, FIGS. 8–11 of Splittgerber show that the way to reduce surface roughness is to reduce the temperature at which the film is grown; and at about 550° the surface is hillock-free. But at 550° C., FIG. 4 shows the film's resistivity is about 40 ohms/square versus about only 25 ohms/square when grown at 700° C. Also, at 550° C., the growth rate of the film is less than half the growth rate of the film at 700° C., which is too slow for a mass production environment.

BRIEF SUMMARY OF THE INVENTION

Accordingly, a primary object of the invention is to provide an improved method for fabricating doped polycrystalline silicon films.

Still another object of the invention is to provide a method of fabricating in-situ doped polycrystalline silicon films that have a smooth surface, have a low sheet resistivity, have a small uniform grain size, and are grown with a small number of steps at a rapid rate.

These and other objects are accomplished in accordance with the invention by a method which includes steps of:

providing a deposition chamber and a wafer therein on which the polycrystalline silicon film is to be fabricated; and introducing one gas containing silicon atoms and another gas containing dopant atoms into the chamber with respective flow rates; wherein the respective flow rates are gradually increased in an overdamped fashion from zero to respective steady state values over a start-up time interval which lasts at least one (1) minute, while simultaneously the ratio of the respective flow rates is kept within twenty-five percent (25%) of the ratio of the steady state values.

Also preferably, while the above steps are carried out, the temperature within the chamber is maintained between 650° C. and 750° C.; the respective flow rates are increased from zero to their respective steady state values in an exponential fashion and the respective flow rates are limited to not overshoot the steady state values by more than twenty-five percent (25%); the gases used are one hundred percent (100%) $SiH_4$ and five percent (5%) $PH_3$- ninety-five percent (95%) $N_2$; the steady state flow rate of the $SiH_4$ gas is at least ten (10) times the steady state flow rate of the $PH_3$ gas; and the pressure inside the chamber is maintained at less than one (1) torr.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
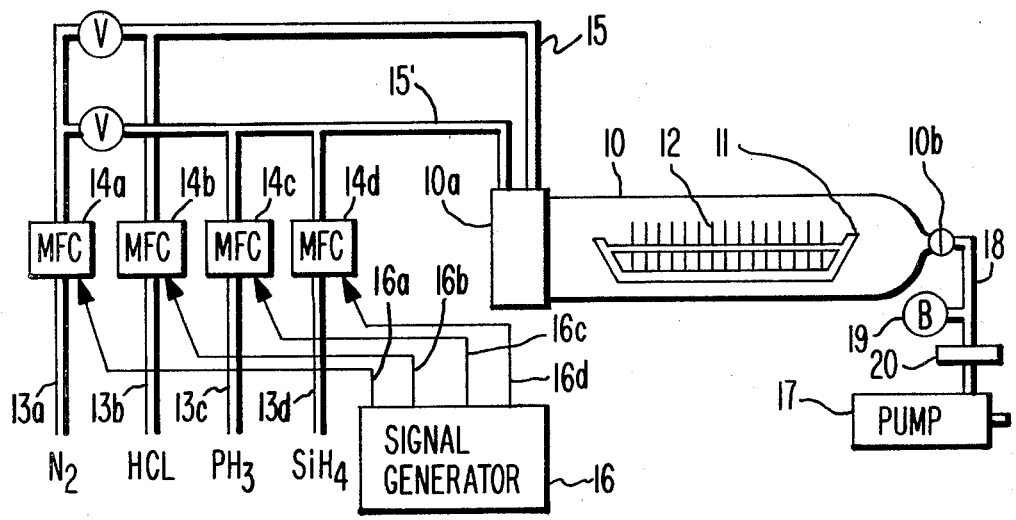
FIG. 1 illustrates a system for carrying out the steps of the invention.

Referring now to FIG. 1, a preferred system for carrying out the steps of the invention will be described. This system includes a deposition chamber 10 containing one or more boats 11 that holds a plurality of wafers 12 on which an in-situ doped polycrystalline silicon film is to be grown. Each boat, for example, can contain 180 wafers spread 3/32" apart, with several "dummy" wafers (e.g., five) placed in each end of the boat.

Various gases that are needed to grow the film are introduced into chamber 10 at one end 10a and removed therefrom at an opposite end 10b. Those gases consist of $N_2$, HCl, 5% $PH_3$-95% $N_2$, and $SiH_4$. Prior to entering chamber 10, the gases pass through respective tubes 13a–13d which lead into respective mass flow controllers 14a–14d. Then, from the mass flow controllers, the HCl gas passes through one tube 15 into chamber 10 while the 5% $PH_3$-95% $N_2$, and $SiH_4$ gases pass through another tube 15' into chamber 10. The $N_2$ gas passes from its controller 14a through a pair of one-way valves and into tubes 15 and 15'.

Also included in the FIG. 1 system is a control signal generator 16 having leads 16a–16d which respectively connect to the mass flow controllers 14a–14d. In operation, generator 16 generates control signals on the leads 16a–16d which control the time sequence and rate at which the gases $N_2$, HCl, $PH_3$, and $SiH_4$ respectively pass through the mass flow controllers 14a–14d. Suitably, generator 16 is the Thermco unit 60100-C as illustrated on page 8D of the Thermco Operation and Maintenance Manual, Vacuum Chemical Vapor Deposition System, VCVD-001, September 1980.

Further included in the FIG. 1 system is a pump 17 which removes the gases from chamber 10. The pump couples to end 10b of chamber 10 via a tube 18. A barometer 19 and a filter 20 also couple to the tube 18 to respectively measure the pressure of the gas in chamber 10 and filter the gas from chamber 10.

Figure 2:
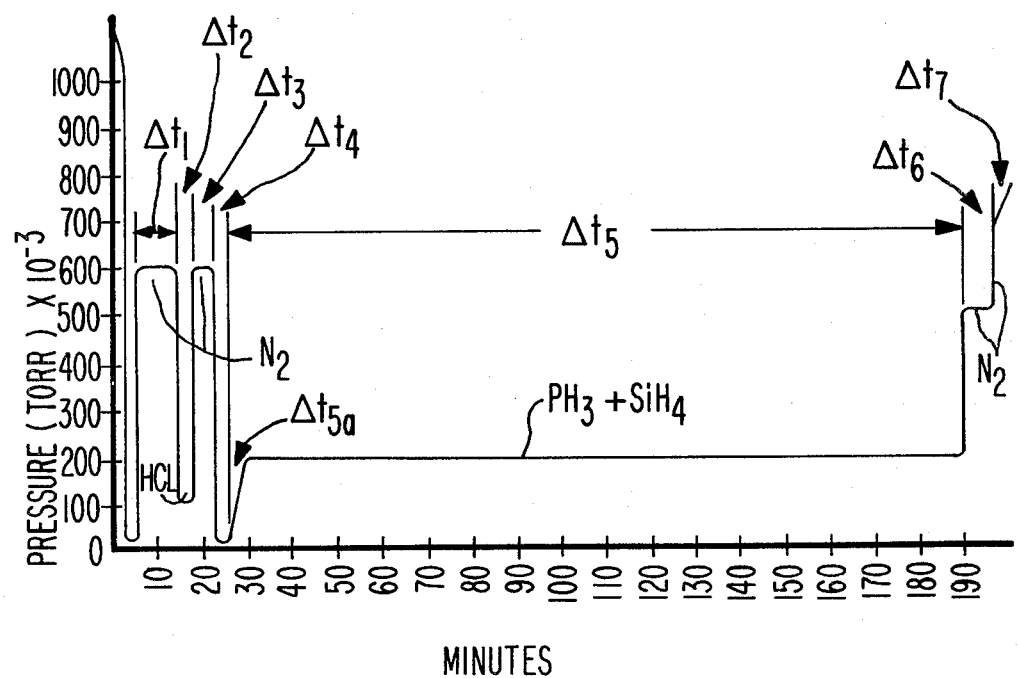
FIG. 2 illustrates a preferred sequence for intoducing the gases into the deposition chamber of the FIG. 1 system.

Next, referring to FIG. 2, a preferred sequence by which the gases $N_2$, HCl, $PH_3$, and $SiH_4$ are introduced into chamber 10 will be described. To begin, the pressure in chamber 10 is pumped down to approximately 10 mT (10 milli-torr). Then, during a time interval $\Delta t_1$ which lasts approximately fifteen minutes, gas $N_2$ passes through chamber 10 at a pressure of about 600 mT. This step enables the temperature within chamber 10 to stabilize at a preselected set point.

Then, during time interval $\Delta t_2$ which lasts approximately five minutes, gas HCl is passed through chamber 10 at a pressure of 100 mT. This step cleans any mobile contaminant ions (e.g., such as sodium) from the surface of the wafers 12.

Subsequently, during time interval $\Delta t_3$ which lasts approximately five minutes, gas $N_2$ is passed through chamber 10 at a pressure of 600 mT. This step purges chamber 10 of the HCl gas.

Thereafter, during time interval $\Delta t_4$ which lasts approximately one minute, the pressure in chamber 10 is pumped down to approximately 10 mT. This step removes all gases from the chamber in preparation for the actual deposition of the polycrystalline silicon film.

Next, during time interval $\Delta t_5$ which lasts approximately one hundred forty (140) minutes, gases $PH_3$ and $SiH_4$ are simultaneously introduced into chamber 10 at a pressure of approximately 200 mT. These gases react in chamber 10 to form the in-situ doped polycrystalline silicon film on the surface of the wafers 12. Additional details on this step are described below in conjunction with FIGS. 3-7.

Then during time interval $\Delta t_6$, which lasts approximately five minutes, gas $N_2$ is introduced into chamber 10 at a pressure of 600 mT. This step purges chamber 10 of the $PH_3$ and $SiH_4$ gases.

Thereafter, during time interval $\Delta t_7$ which lasts approximately three minutes, chamber 10 is returned to atmospheric pressure by introducing gas $N_2$ into it while reducing the pumping action of pump 17. This step allows chamber 10 to be opened and the wafers 12 to be removed.

In accordance with the present invention, the gases $PH_3$ and $SiH_4$ are introduced into chamber 10 during a start-up period $\Delta t_{5a}$ of time interval $\Delta t_5$ in a novel manner. Specifically, during start-up period $\Delta t_{5a}$, the flow rates of the $PH_3$ and $SiH_4$ gases are increased gradually in an overdamped fashion from zero to respective steady state values; while simultaneously, the ratio of those flow rates is kept within a predetermined fraction of the ratio of the steady state values. Preferably, the time period $\Delta t_{5a}$ in which the flow rates gradually increase lasts at least sixty seconds, and the fraction by which ratio of the instantaneous flow rates varies from the ratio of the steady state flow rates is no more than one-fourth.

Further, during start-up period $\Delta t_{5a}$, the respective flow rates of the gases $PH_3$ and $SiH_4$ are limited to not overshoot their steady state flow rates by a predetermined fraction. That fraction also preferably is not more than one-fourth.

Columns B and C of the Table below list the respective flow rates of the $PH_3$ and $SiH_4$ gases as they were measured at various time instants while the above gradual start-up was carried out. Also, Column A lists the time instants in seconds at which the flow rates were measured; while Column D lists the ratio of the measured flow rates.

TABLE

| A SEC | B 5% $PH_3$ | C $SiH_4$ | D RATIO | B' 5% $PH_3$ | C' $SiH_4$ | D' RATIO |
|---|---|---|---|---|---|---|
| 0 | 0 | 0 | 0 | 0 | 0 | 0 |
| 4 | 0.27 | 5.0 | $2.70 \times 10^{-3}$ | 20.0 | 90.0 | $11.11 \times 10^{-3}$ |
| 8 | 0.53 | 10.1 | $2.62 \times 10^{-3}$ | 12.3 | 66.4 | $9.26 \times 10^{-3}$ |
| 12 | 0.80 | 15.1 | $2.65 \times 10^{-3}$ | 3.9 | 54.2 | $3.59 \times 10^{-3}$ |
| 15 | 1.0 | 18.9 | $2.65 \times 10^{-3}$ | 10.2 | 45.0 | $11.33 \times 10^{-3}$ |
| 30 | 2.0 | 37.8 | $2.65 \times 10^{-3}$ | 8.6 | 69.3 | $6.20 \times 10^{-3}$ |
| 45 | 2.4 | 45.0 | $2.66 \times 10^{-3}$ | 4.6 | 56.8 | $4.05 \times 10^{-3}$ |
| 60 | 2.8 | 52.2 | $2.66 \times 10^{-3}$ | 4.2 | 62.3 | $3.37 \times 10^{-3}$ |
| 90 | 2.8 | 57.0 | $2.44 \times 10^{-3}$ | 3.4 | 60.5 | $2.81 \times 10^{-3}$ |
| 120 | 3.0 | 58.8 | $2.59 \times 10^{-3}$ | 3.4 | 60.6 | $2.80 \times 10^{-3}$ |
| 180 | 3.2 | 59.4 | $2.67 \times 10^{-3}$ | 3.4 | 60.7 | $2.80 \times 10^{-3}$ |
| 300 | 3.4 | 61.1 | $2.78 \times 10^{-3}$ | 3.5 | 60.3 | $2.90 \times 10^{-3}$ |
| 600 | 3.6 | 60.9 | $2.95 \times 10^{-3}$ | 3.4 | 60.5 | $2.81 \times 10^{-3}$ |
| 3600 | 3.4 | 60.1 | $2.82 \times 10^{-3}$ | 3.5 | 60.5 | $2.89 \times 10^{-3}$ |

Figure 3:
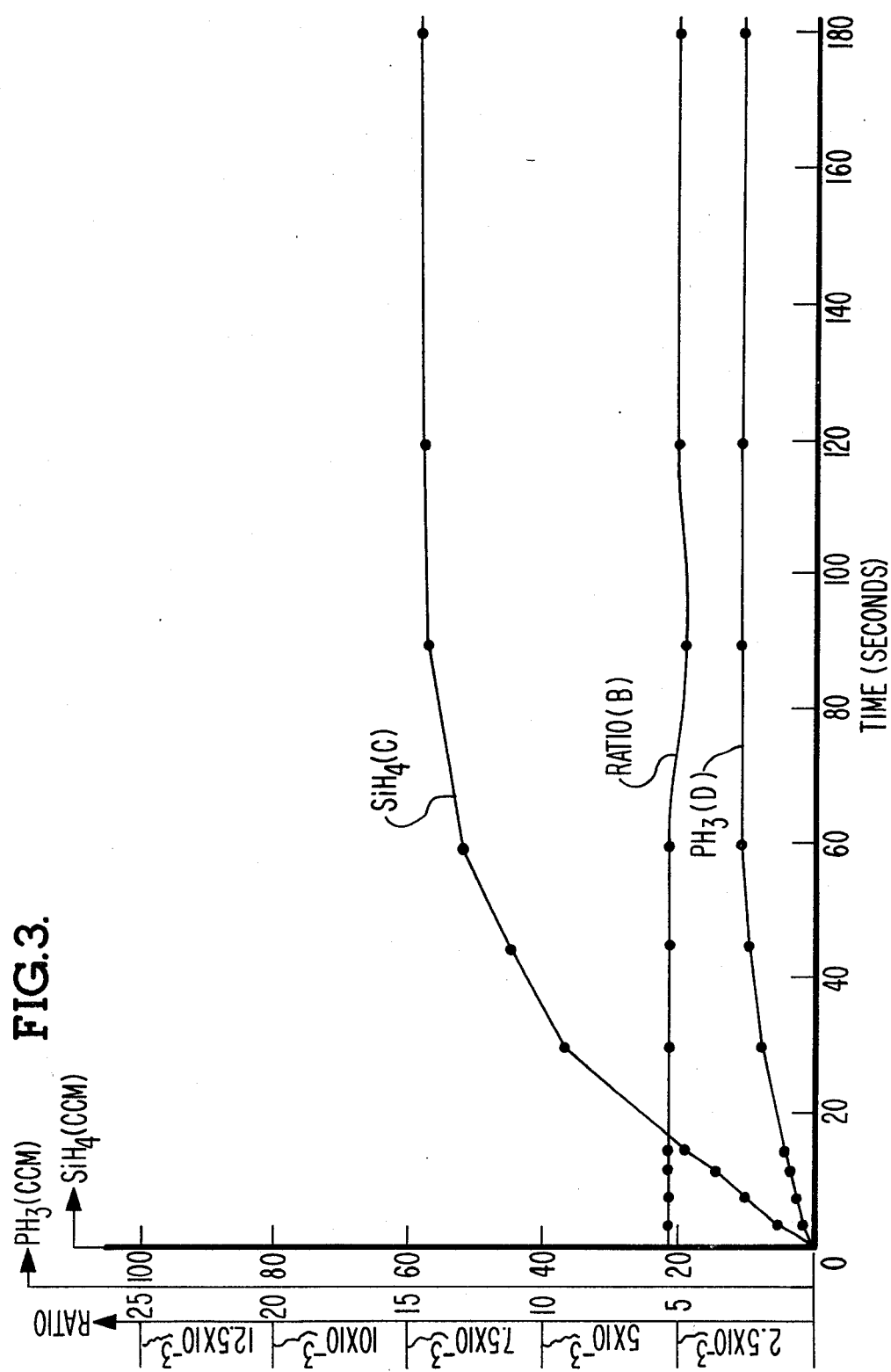
FIG. 3 illustrates the gas flow rates and their ratio in the deposition chamber during a gradual start-up of time interval $\Delta t_5$ in FIG. 2.

In FIG. 3, the $PH_3$ flow rates of Column B are plotted as a curve B; the $SiH_4$ flow rates of Column C are plotted as a curve C, and the flow rate ratio of Column D is plotted as a curve D.

Curves B and C show that the start-up time interval $\Delta t_{5a}$ during which the PH$_3$ and SiH$_4$ flow rates were gradually increased to their steady state value lasted about ninety seconds. Further, curve D shows that during start-up time interval $\Delta t_{5a}$, the ratio of the PH$_3$ and SiH$_4$ flow rates stayed well within 25% of the ratio of the steady state flow rates. Also, curves B and C show that during the start-up time $\Delta t_{5a}$, the PH$_3$ and SiH$_4$ flow rates did not overshoot their steady state values.

By comparison, Columns B' and C' of Table 1 list respective flow rates for the PH$_3$ and SiH$_4$ gases as they were measured at various time instants during a conventional polysilicon deposition process in which the gases burst into the deposition chamber 10 at the start of the process. Also, Column D' gives the ratio of those measured flow rates.

Figure 4:
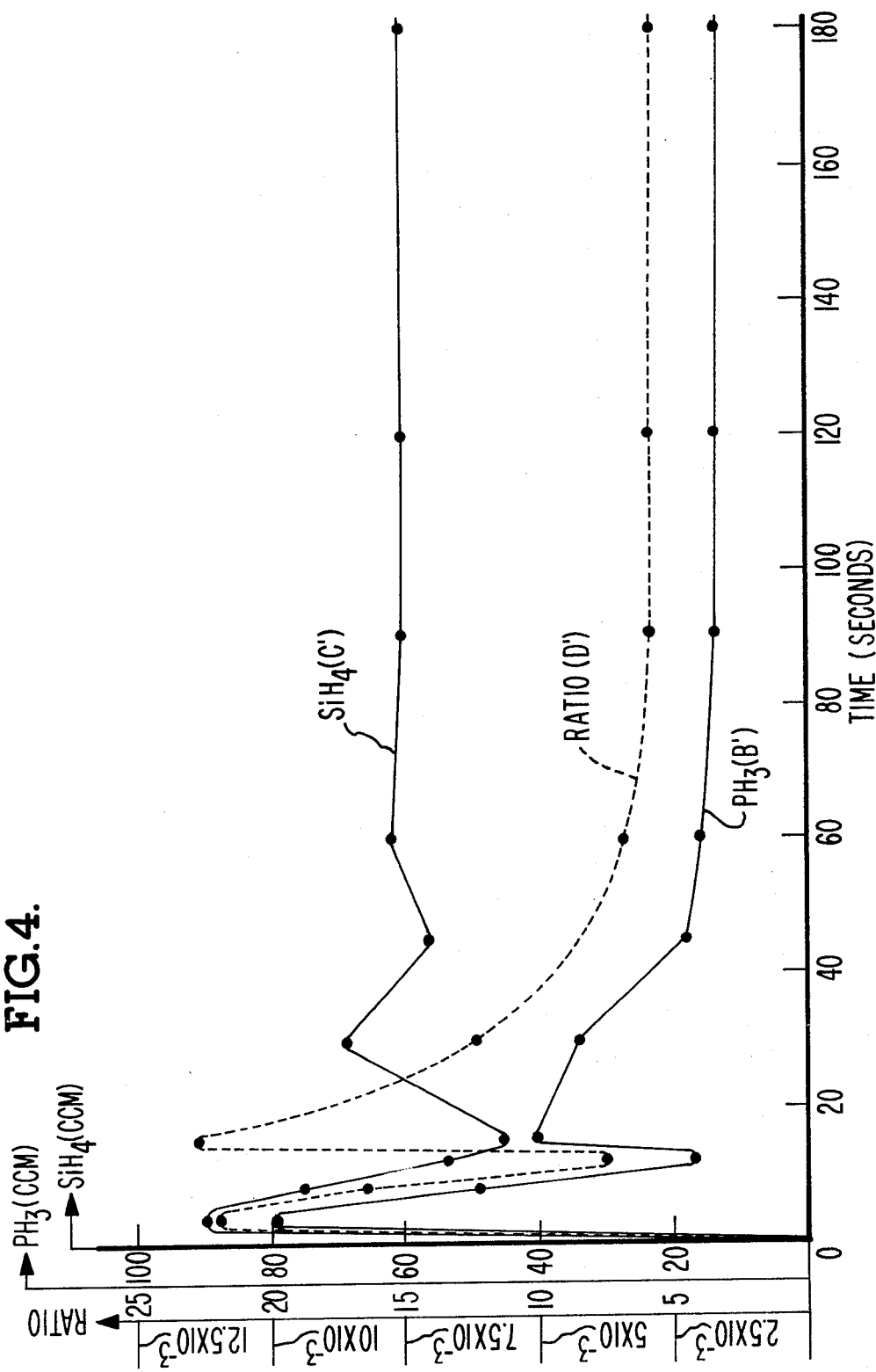
FIG. 4, by comparison, shows the gas flow rates and their ratio as the gases are burst into the deposition chamber at the start of interval $\Delta t_5$ in FIG. 2.

In FIG. 4, the PH$_3$ flow rates of Column B' are plotted as a curve B'; the SiH$_4$ flow rates of Column C' are plotted as a curve C'; and the flow rate ratios of Column D' are plotted as a curve D'. Inspection of these curves B', C', and D' shows that their shape is totally different than the corresponding curves B, C, and D of FIG. 3.

Curves B' and C' show that when the PH$_3$ and SiH$_4$ gases are allowed to burst into the deposition chamber 10, the flow rates of those gases greatly overshoot their respective steady state values. Then, the respective flow rates alternately decrease and increase as a damped oscillation for about ninety seconds to the respective steady state values.

Further, the oscillations in the flow rates of curves B' and C' are completely out of synchronization with each other. Thus, the ratio of the PH$_3$ and SiH$_4$ flow rates varies in an uncontrolled fashion until the steady state flow rates are reached. This is shown by curve D'.

Figure 5:
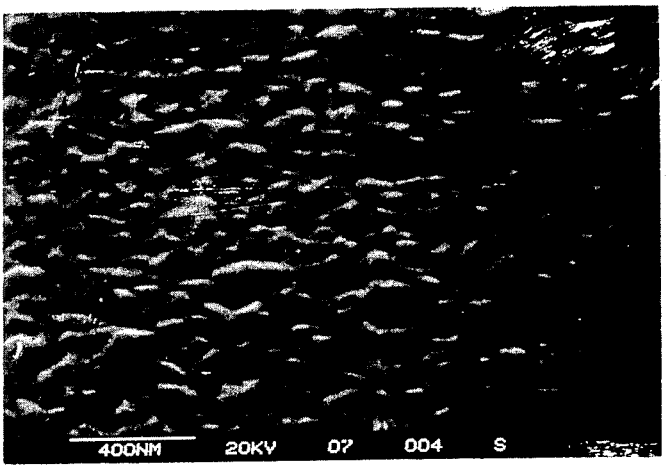
FIG. 5 is a microphotograph illustrating the surface of a polycrystalline silicon film that is fabricated with the gradual start-up of FIG. 3.
Figure 6:
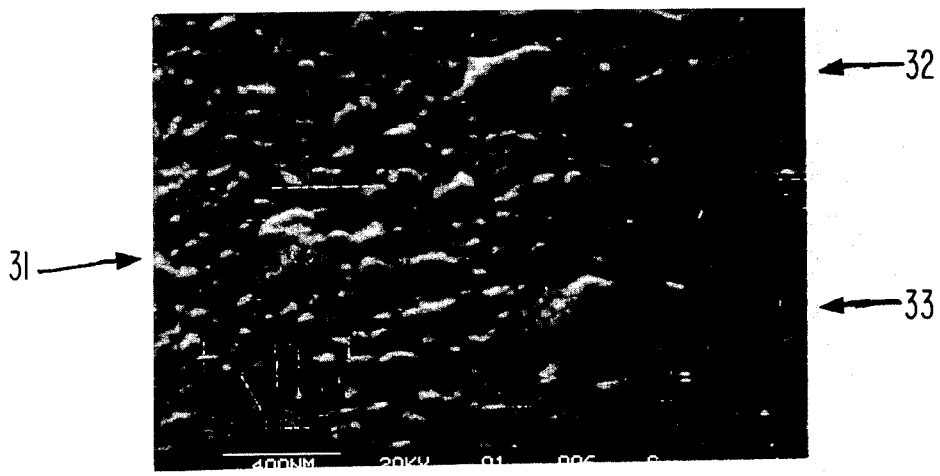
FIG. 6, by comparison, is a microphotograph showing the surface of a polycrystalline silicon film that is fabricated with the start-up sequence of FIG. 4.

FIGS. 5 and 6 show how the two different start-up sequences of FIGS. 3 and 4 affect the quality of the polycrystalline silicon film that is being grown. FIG. 5 is a ×25,000 microphotograph of a polycrystalline silicon film that was fabricated by incorporating the start-up process of FIG. 3 into the overall deposition process of FIG. 2. By comparison, FIG. 6 is a ×25,000 microphotograph of a polycrystalline silicon film that was fabricated by the same overall deposition process of FIG. 2, but which incorporated the start-up sequence of FIG. 4.

Inspection of FIG. 5 shows that the surface of the polycrystalline silicon film grown by the start-up sequence of FIG. 3 is very smooth, has a uniformly small granularity, and is hillock-free. By comparison, FIG. 6 shows that the surface of the polycrystalline silicon film grown by the start-up sequence of FIG. 4 is much rougher, has a non-uniform granularity, and has hillocks as indicated by reference numerals 31–33. These same results were obtained on hundreds of different wafers.

Further, the improved surface smoothness that is obtained with the disclosed process is so pronounced that it can even be detected optically without the aid of a microscope. This is achieved by shining a bright narrow beam of light, such as a light beam from a 300 watt bulb from a slide projector, over the surface of a wafer at an angle of 20°–40°. If the wafer has been processed with the gradual start-up of FIG. 3, then it will appear very shiny and specular; whereas if the wafer has been processed with the start-up of FIG. 4, then it will appear hazy.

Based on the above, it is the inventor's belief that the roughness of the film of Fig. 6 is caused by the uncontrolled underdamped oscillations in the ratio of the PH$_3$ and SiH$_4$ gas flow rates during the early stages of the deposition process. Those oscillations cause bumps in the film to nucleate in a random fashion on the wafer surface. And once the bumps have nucleated, they do not go away with further processing at a constant flow rate ratio.

Preferably, the above steps are carried out at 675° C.–725° C. And the temperature at which the polycrystalline films of FIGS. 5 and 6 were grown was 700° C. This high temperature is significant because, as stated in the background portion of this disclosure, a deposition temperature of about 700° C. operates to minimize the resistance of the deposited polycrystalline film.

Thus, the hundreds of films that were produced by the disclosed process not only had the smooth surface of FIG. 5 but they also had a sheet resistance of only 15–25 ohms/square. Further, due to the high temperature, the films grew rapidly at a rate of 35 Å/min. So, in summary, the disclosed process attains not just some, but all of the desirable features for a polycrystalline silicon film that were previously pointed out.

Various mass flow controllers may be utilized to achieve the start-up sequence of FIG. 3. For example, one can use a Tylan model FC-260, or a Unit Instruments model 1000. In these mass flow controllers, the gas flow rate is set by an external analog control signal on a lead 16a–16d in FIG. 1. The magnitude of the control signal is permitted to range between zero and five volts; and the gas flow rate through the mass flow controller is regulated to be proportional to the magnitude of the control signal.

Internally in the mass flow controller, the actual flow rate of the gas is measured; and an analog sensor signal is generated with a magnitude proportional to that actual flow rate. Then, the sensor signal is compared with the control signal; and any imbalance between the two signals generates an error signal. That error signal then moves an electromechanical valve such that the desired flow rate is obtained.

In other words, the mass flow controller operates as a closed loop control system in which the system receives a control signal on a lead 16a–16d; the controlled output of the system is monitored and compared to the control signal; and the difference between the two signals generates an error signal which is utilized to modify the controlled output.

However, while this invention was being reduced to practice, the above mass flow controllers and all others that were commercially available responded too quickly to changes in their input control signal, and their response was very underdamped. The slowest response that the inventor could obtain was with the Tylan FC-260 controller; but even in it the flow rate was guaranteed to reach the flow rate specified by the control signal after a period of only seven seconds. And that response was completely inadequate since the gas flow rate still varied as a damped oscillation for about one minute as shown in FIG. 4 after the seven seconds elapsed. Thus, the ratio of the gases varied wildly and the resulting polycrystalline silicon film had a rough surface just as shown in FIG. 6.

Figure 7:
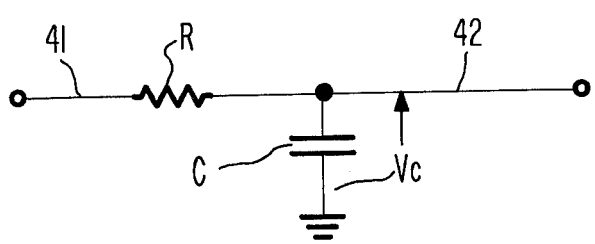
FIG. 7 illustrates a circuit for use with the mass flow controllers of FIG. 1 to obtain the gradual start-up sequence of FIG. 3.

In the present invention, damped oscillations in the gas flow rate are eliminated by sending respective control signals on the leads 16c and 16d which are slowly varying and proportional in shape to the flow rates that are plotted in FIG. 3. Such control signals can readily be generated by any number of circuits. For example, they can be generated by sending a step input signal with an amplitude proportional to the desired steady state flow rate through a simple low pass R-C circuit as shown in FIG. 7. This circuit is inserted in lines 16c and 16d of FIG. 1 such that terminal 41 receives the step-shaped control signal from generator 16 while terminal 42 connects to the mass flow controller.

Since the capacitor voltage $V_C$ in the FIG. 7 circuit cannot change instantaneously, that voltage starts from zero and rises toward the steady state value in an exponential manner just like the curves of FIG. 3. And the time, in seconds, in which the voltage $V_C$ will reach nine-tenths (9/10) of its final value is 2.3RC, where R is in ohms and C is in farads.

Various steps for carrying out the invention have now been described in detail. In addition, however, many changes and modifications may be made to these details without departing from the nature and spirit of the invention. For example, other dopant gases, such as arsenic, can replace the dopant gas $PH_3$. Also, many other circuits which give an output voltage proportional to the waveforms of FIG. 3 can replace the FIG. 7 circuit. For example, in a non-automated environment, the control signals can be generated by sending a constant current through a potentiometer while slowly increasing the potentiometer resistance by hand and using the potentiometer voltage as the control signal.

In addition, the disclosed method can be applied to the fabrication of films, other than in-situ doped polysilicon, where at least two reactant gases are introduced into a chamber at a constant ratio. For example, the disclosed method can be applied to introduce $NH_3$ and $SiH_2Cl_2$ into a chamber at a constant ratio to fabricate a layer of $Si_3N_4$ with improved smoothness on a semiconductor wafer.

Accordingly, since many such minor variations are possible, it is to be understood that the invention is not limited to the said details but is defined by the appended claims.

What is claimed is:

1. A method of fabricating a film of in-situ doped polycrystalline silicon having a surface that is free of microscopic hillocks, said method including the steps of:
    providing a deposition chamber and a wafer therein on which said film is to be fabricated; and
    introducing one gas containing silicon atoms and another gas containing dopant atoms into said chamber with respective flow rates; wherein
    said respective flow rates are gradually increased in an overdamped fashion over a start-up time interval of at least one minute from zero to respective steady state values while simultaneously the ratio of said respective flow rates is kept within 25% of the ratio of said steady state values.

2. A method according to claim 1 wherein the inside of said chamber is maintained at a temperature of 675° C.-725° C.

3. A method according to claim 2 wherein said respective flow rates are increased from zero to their respective steady state values in an exponential fashion.

4. A method according to claim 3 wherein said one gas is $SiH_4$ and said another gas is $PH_3$.

5. A method according to claim 4 wherein said steady state flow rate of $SiH_4$ is at least ten times said steady state flow rate of $PH_3$.

6. A method according to claim 5 wherein the inside of said chamber is maintained at a pressure of less than one torr while said gases are being introduced into it.

7. A method of fabricating a film of in-situ doped polycrystalline material having a surface that is free of microscopic hillocks, said method including the steps of:
    providing a deposition chamber and a wafer therein on which said film is to be fabricated; and
    introducing one gas into said chamber which contains atoms of said polycrystalline material and simultaneously introducing another gas into said chamber which contains dopant atoms for said polycrystalline material; wherein
    said gases are introduced at respective flow rates which increase in a gradual fashion over a start-up time interval from zero to respective steady state values such that the ratio of said flow rates varies by no more than a predetermined fraction.

8. A method according to claim 7 wherein the inside of said chamber is maintained at a temperature of 675° C.-725° C.

9. A method according to claim 7 wherein said respective flow rates are limited during said start-up time interval to not overshoot said steady state values by more than 25%.

10. A method according to claim 7 wherein said respective flow rates are increased from zero to their respective steady state values in an exponential fashion.

11. A method according to claim 9 wherein said start-up time interval is at least one minute.

12. A method according to claim 7 wherein said one gas is $SiH_4$ and said another gas is $PH_3$.

13. A method according to claim 7 wherein said steady state flow rate of $SiH_4$ is at least ten times said steady state flow rate of $PH_3$.

14. A method according to claim 7 wherein the inside of said chamber is maintained at a pressure of less than one torr while said gases are being introduced into it.

15. A method of fabricating a film of material having a surface that is free of microscopic hillocks, said method including the steps of:
    providing a deposition chamber and a wafer therein on which said film is to be fabricated; and
    introducing one gas into said chamber which contains atoms of one type and simultaneously introducing another gas into said chamber which contains atoms of another type; wherein
    said gases are introduced at respective flow rates which increase from zero to respective steady state values in an overdamped fashion while the ratio of said flow rates is confined to stay within 25% of the ratio of said steady state values.

* * * * *